United States Patent
Murayama

(10) Patent No.: US 10,283,679 B2
(45) Date of Patent: May 7, 2019

(54) LIGHT EMITTING DEVICE AND LIGHT SOURCE MODULE

(71) Applicant: NICHIA CORPORATION, Anan-shi, Tokushima (JP)

(72) Inventor: Takashi Murayama, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/817,585

(22) Filed: Aug. 4, 2015

(65) Prior Publication Data
US 2016/0043284 A1    Feb. 11, 2016

(30) Foreign Application Priority Data
Aug. 6, 2014  (JP) .................................. 2014-160207

(51) Int. Cl.
*H01L 33/48* (2010.01)
*H01L 25/075* (2006.01)

(52) U.S. Cl.
CPC ........ *H01L 33/486* (2013.01); *H01L 25/0753* (2013.01); *H01L 2924/0002* (2013.01)

(58) Field of Classification Search
CPC ............... H01L 33/486; H01L 25/0753; H01L 33/483; H01L 33/52; H01L 23/02; H01L 23/04

See application file for complete search history.

(56) References Cited

U.S. PATENT DOCUMENTS

| 4,295,152 A | * | 10/1981 | Khoe ................... G02B 6/4204 257/434 |
| 6,392,177 B1 | * | 5/2002 | Zhang .................... H01H 13/56 200/406 |
| 2001/0014490 A1 | | 8/2001 | Ida et al. |
| 2003/0022537 A1 | * | 1/2003 | Bricaud ............... G06K 7/0021 439/152 |
| 2004/0104460 A1 | * | 6/2004 | Stark ..................... B81B 7/0067 257/678 |
| 2004/0231879 A1 | * | 11/2004 | Ebihara ................. H01L 23/552 174/521 |
| 2005/0152634 A1 | | 7/2005 | Okamoto et al. |
| 2006/0092812 A1 | * | 5/2006 | Tateyanagi .......... H01L 31/0203 369/112.01 |

(Continued)

FOREIGN PATENT DOCUMENTS

JP    61-008147 U1    1/1986
JP    05-206308 A    8/1993

(Continued)

*Primary Examiner* — Marc Anthony Armand
*Assistant Examiner* — Sue Tang
(74) *Attorney, Agent, or Firm* — Global IP Counselors, LLP

(57) ABSTRACT

A light emitting device, has: a light emitting element; a substrate having a first main surface on which the light emitting element is mounted, and recesses on side surfaces adjacent to the first main surface, a cap covering the light emitting element, and having a light-transmissive member and a metal frame that supports the light-transmissive member and has side pieces extending toward the substrate from above the first main surface of the substrate, and tabs that is bended and extend from the side pieces and housed a part thereof in the recesses of the substrate.

22 Claims, 9 Drawing Sheets

(56) References Cited

U.S. PATENT DOCUMENTS

| | | | |
|---|---|---|---|
| 2007/0058378 A1 | 3/2007 | Moriyama et al. | |
| 2007/0064450 A1 | 3/2007 | Chiba et al. | |
| 2007/0230182 A1 | 10/2007 | Tai et al. | |
| 2012/0129370 A1* | 5/2012 | Zhou | G06K 13/08 439/188 |
| 2012/0175653 A1 | 7/2012 | Weber | |
| 2015/0009679 A1 | 1/2015 | Seki et al. | |

FOREIGN PATENT DOCUMENTS

| | | |
|---|---|---|
| JP | 2001-093998 A | 4/2001 |
| JP | 2001-230275 A | 8/2001 |
| JP | 2003-100925 A | 4/2003 |
| JP | 2004-055959 A | 2/2004 |
| JP | 2004-349356 A | 12/2004 |
| JP | 2005-229088 A | 8/2005 |
| JP | 2008-078668 A | 4/2008 |
| JP | 2008-193133 A | 8/2008 |
| JP | 2013-178459 A | 9/2013 |
| JP | 2013-191685 A | 9/2013 |
| JP | 2014-503120 A | 2/2014 |
| WO | 2005-088191 A1 | 9/2005 |

* cited by examiner

LIGHT EMITTING DEVICE AND LIGHT SOURCE MODULE

CROSS-REFERENCE TO RELATED APPLICATIONS

This application claims priority to Japanese Patent Application No. 2014-160207 filed on Aug. 6, 2014. The entire disclosure of Japanese Patent Application No. 2014-160207 is hereby incorporated herein by reference.

BACKGROUND

Technical Field

The present disclosure relates to a light emitting device and a light source module.

Related Art

Light emitting devices in which a light emitting diode, a laser diode, or another such light emitting element is provided on a substrate have been proposed in the past. With a light emitting device such as this, the light emitting element is fixed to a mounting substrate on which a circuit or the like is formed. A transmissive cover or the like is provided to protect the light emitting element or any wires, etc., that are connected to the light emitting element (For example, JP2013-191685A).

The light emitting devices in which a light emitting element is mounted need to be made more compact, including their covers.

SUMMARY

The present disclosure relates to a light emitting device. The light emitting device has a light emitting element, a substrate and a cap covering the light emitting element, and having. The substrate has a first main surface on which the light emitting element is mounted, and recesses on side surfaces adjacent to the first main surface. The cap has a light-transmissive member and a metal frame that supports the light-transmissive member. The metal frame has side pieces extending toward the substrate from above the first main surface of the substrate, and tabs that is bended and extend from the side pieces and housed a part thereof in the recesses of the substrate.

Further, the present disclosure relate to a light source module. The light source module has a plurality of light emitting devices, as described above, arranged.

One embodiment of the present invention provides a light emitting device and a light source module that can be made more compact.

DETAILED DESCRIPTION

Figure 1A:
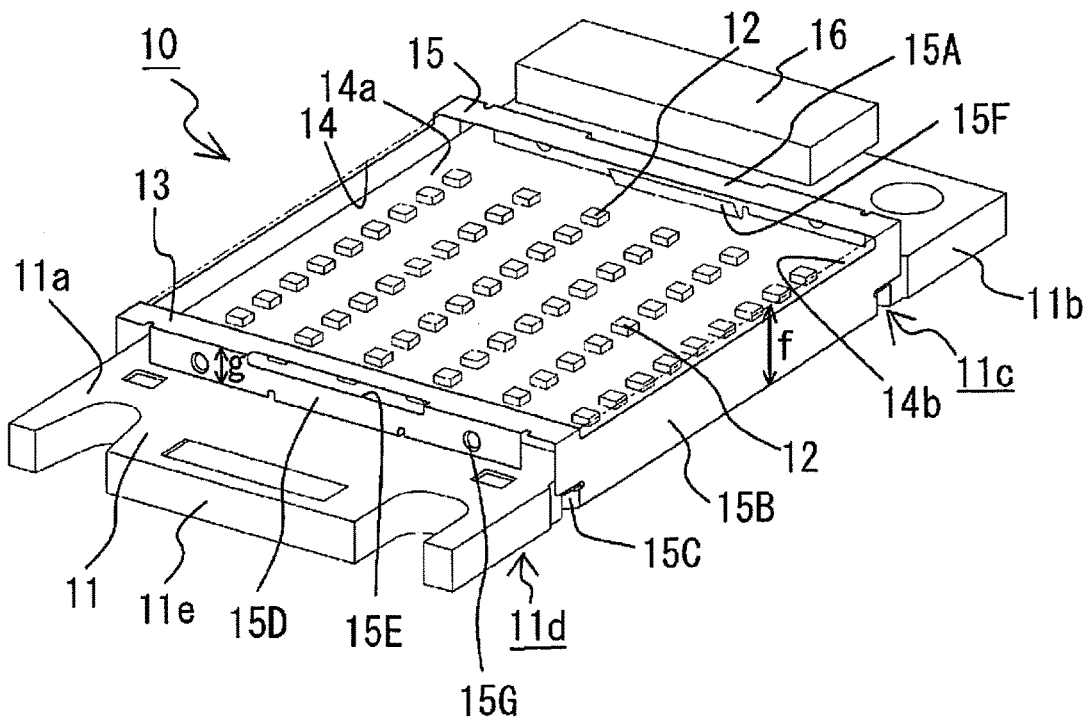
FIG. 1A is a schematic oblique view of an embodiment of a light emitting device.
Figure 1B:
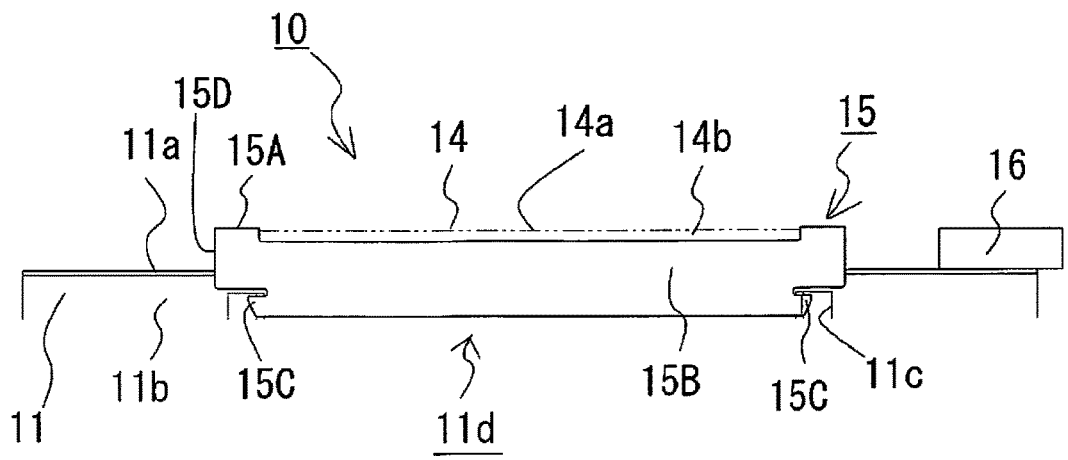
FIG. 1B is a schematic side elevational view of the light emitting device in FIG. 1A as seen from a first side of the light emitting device.
Figure 1C:
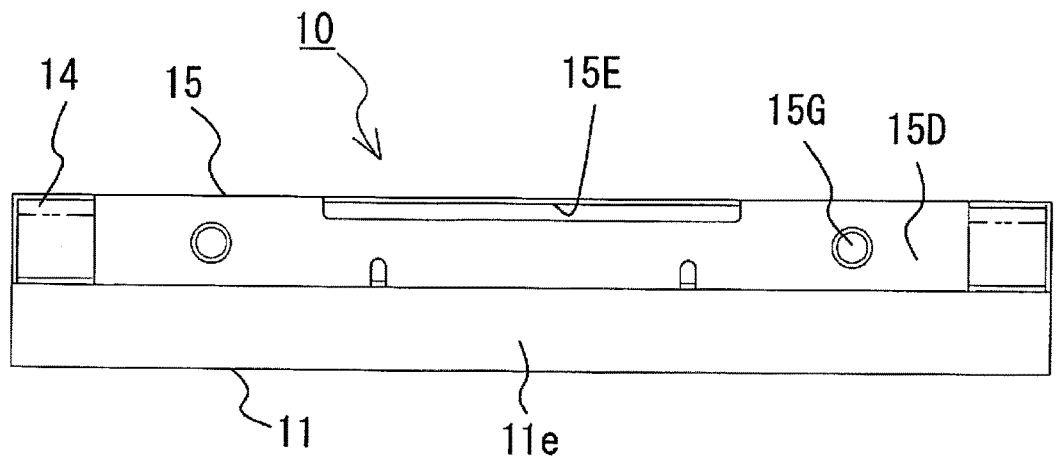
FIG. 1C is a schematic side elevational view of the light emitting device in FIG. 1A as seen from a second side of the light emitting device.

The light emitting device in this embodiment mainly includes a light emitting element, a substrate, and a cap. With this light emitting device, light emitted from the light emitting element is extracted through the cap, and more precisely, through the light-transmissive member provided to the cap.

Improvements to the light extraction efficiency of light emitting elements, and advances in high-density mounting technology for light emitting elements and cooling technology in recent years have increased the amount of light released from a light emitting device that makes use of light emitting elements. And this has expanded the field of application, which includes high-luminance illumination-use light sources, light sources for devices the cure or expose printing ink or UV curing resins, and so forth. Given this situation, the absorption of light by the light-transmissive member used in the light emitting device is accompanied by the generation of heat. For instance, in the case where the absorptivity of the light-transmissive member with respect to the light from the light emitting element is 10%, and the optical output from the light emitting element (or the light emitting region) is 30 watts, the light-transmissive member may be a source of 3 watts of heat. In particular, when the wavelength band of the light emitted from the light emitting element is the UV region used as the light source for a device that cures or exposes printing ink or UV curing resin, the optical transmissivity of a transmissive material or a metal material will decrease (the optical absorptivity will increase), so deterioration of the material that makes up the light emitting device is particularly pronounced, and there is the risk that reliability as a light source will suffer greatly.

In response to this, the light emitting device and light source module pertaining to this embodiment maintain their compact size while minimizing the decrease in reliability of the light emitting device attributable to heat generation caused by the absorption of light by the light-transmissive member, and maintaining high reliability over an extended period of time.

Light Emitting Element

Light emitting element may contain any one of a light emitting element, such as light emitting diode, laser diode and the like, which is known in the art. For example, the light emitting element emitting ultraviolet, violet, blue, green light may include a semiconductor layer such as ZnSe, nitride-based semiconductor ($In_XAl_YGa_{1-X-Y}N$ ($0 \leq X$, $0 \leq Y$, $X+Y \leq 1$), and GaP, and the light emitting element emitting red or infrared light may include a semiconductor layer such as GaAlAs, and AlInGaP.

The light emitting element may have at least a pair of electrodes and the electrodes may be disposed on the opposite side or the same side of semiconductor layer.

Just one light emitting element may be included in a single light emitting device, or two or more light emitting elements may be included in a single light emitting device. In the latter case, light emitting elements of mutually different emission wavelengths may be used.

The light emitting element may be any mounting manner such as flip-chip mount mounted on the substrate, or mounting in which the bottom surface of the light emitting element may be bonded to the substrate and an electrical connection made with wire, etc. In the case where the light emitting element and the electrode on a base material of the substrate are connected by a wire, a cap can be used to protect the wire.

The mounting of light emitting element to the substrate may be carried out using with a bonding member. Examples of the bonding member include solders such as tin-bismuth-based solder, tin-copper-based solder, tin-silver-based solder, gold-tin-based solder and the like; eutectic alloys such as alloys of Au and Sn, Au and Si, Au and Ge, Au and Cu, Ag and Cu as main components; conductive pastes of silver, gold, palladium and the like; bumps; anisotropic conductive materials; brazing materials such as low-melting-point metals; resins such as epoxy, silicon resins and the like. A materials of in inorganic substance, which is not prone to deterioration by light emission is preferable for bonding of light emitting element emitting ultraviolet radiation. Examples thereof include solder, alloys, eutectic alloys.

Substrate

The substrate may be a flat member, and has a first main surface on which the light emitting device is mounted, and a second main surface on the opposite side from this first main surface. The substrate may be either rigid or flexible, so long as it is thick enough to support light emitting elements which are mounted thereon.

The outer shape of the substrate in plan view (referring to when the substrate is viewed from the first main surface side) may be various shapes, such as a polygonal shape, one or more of whose sides or corners may be rounded. Among them, a shape that is quadrangle in plan view is preferable, and a rectangular shape is more preferable. The shape may include convex or concave parts, cutouts, holes, or the like in a regular or irregular layout.

In particular, a rectangle is preferable when the light emitting device is used as the light source for printing or for resin curing, and when used in a module in which a plurality of light emitting devices are arranged in a row.

The substrate has side surfaces that are adjacent to the first main surface and/or the second main surface. In the case where the substrate is quadrangle in plan view, it will usually have two pairs of side surfaces including a pair of first side surfaces and a pair of second side surfaces. The side surfaces of the substrate may have a step in the thickness direction and/or the direction substantially parallel to the first main surface.

In particular, in the case that the substrate is rectangular in plan view, the first side surfaces may be the side surfaces extending in the lengthwise direction.

The substrate has recesses on the side surfaces. These recesses are used to house and latch the tabs of a metal frame discussed below. Providing these recesses allows a cap to be fixed to the substrate.

The recesses may be provided one to each side surface, but providing two or more is preferable because the cap can be fixed more securely. In the case that the substrate is quadrangle in plan view, the recesses may be formed only on one pair of side surfaces, or may be formed on both pairs of side surfaces.

In the case that the substrate is rectangular in plan view, the recesses may be in the first side surfaces, and no recess may be in the second side surfaces.

Figure 6A:
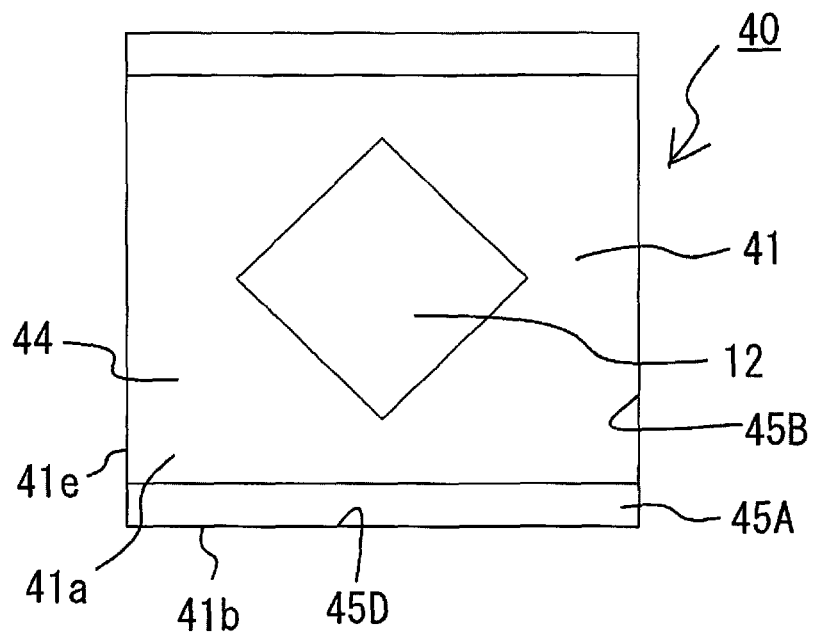
FIG. 6A is a schematic plan view of yet another embodiment of the light emitting device of the present invention.
Figure 6B:
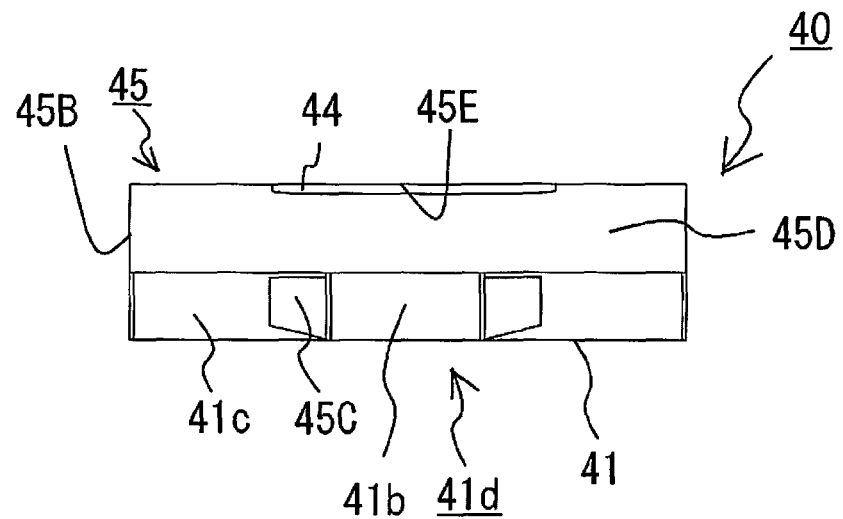
FIG. 6B is a schematic second lateral side view of the light emitting device in FIG. 6A.
Figure 6C:
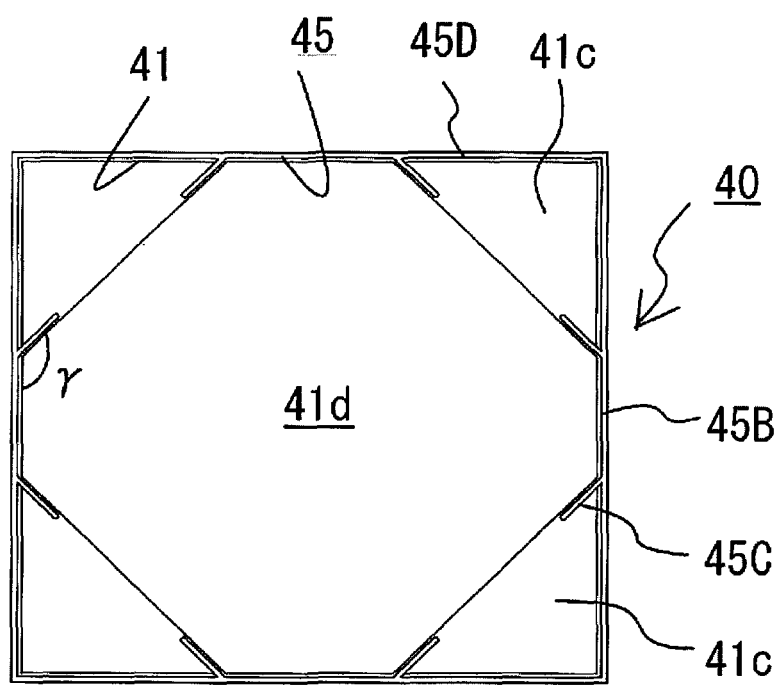
FIG. 6C is a schematic bottom view of the light emitting device in FIG. 6A.

The recesses may be in the form of holes have opening only in the side surfaces, or may be in the form of openings that extend from the first side surface to the second main surface as shown in FIG. 1A, etc., or may be in the form of openings that extend from the first side surface to the second side surface and to the second main surface as shown in FIG. 6C.

The recesses may have different widths in the thickness direction of the substrate, but are preferably columnar, that is, have the same shape in the thickness direction of the substrate. This allows the tabs to be easily latched and housed.

As long as the recesses allow the tabs to be latched, they may have any of various plan view shapes, such as circular, elliptical, polyhedral, or a combination of these.

Figure 1D:
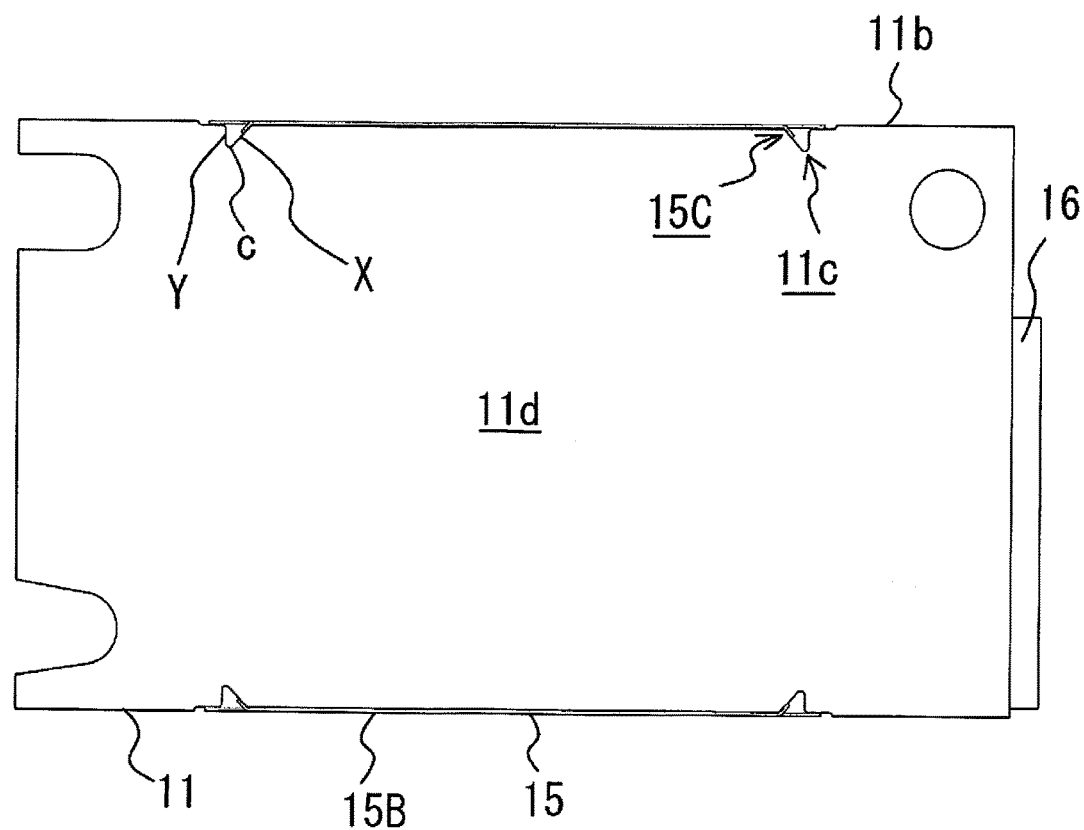
FIG. 1D is a schematic bottom view of the light emitting device in FIG. 1A.
Figure 2A:
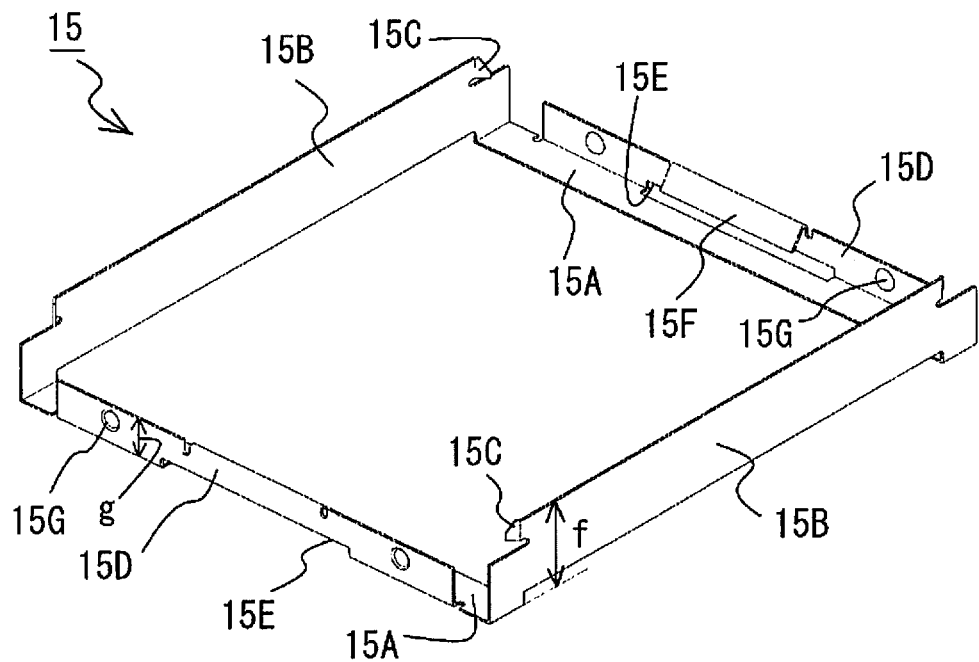
FIG. 2A is a schematic oblique view of an embodiment of the cap of a light emitting device.
Figure 2B:
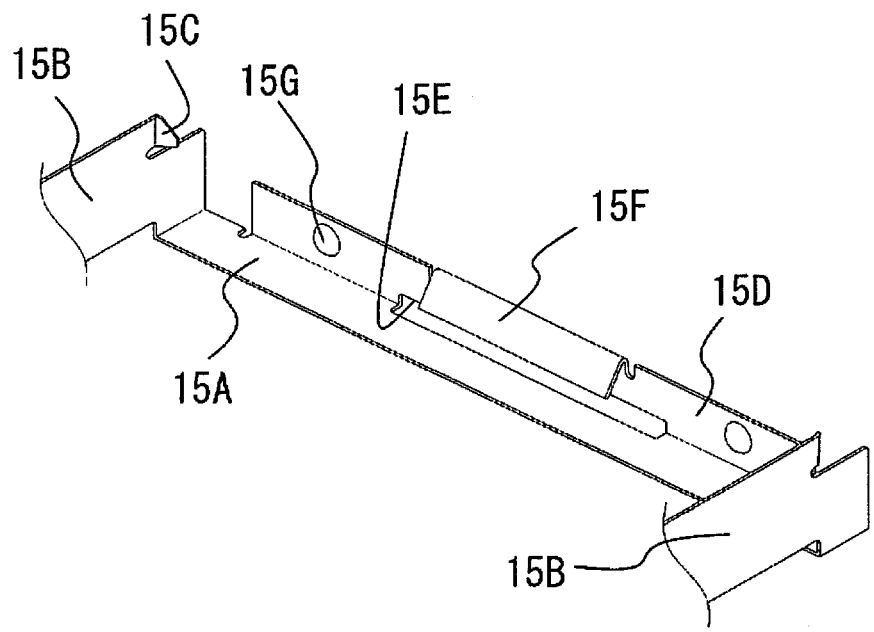
FIG. 2B is a schematic partial enlarged view of the light emitting device in FIG. 2A.
Figure 3A:
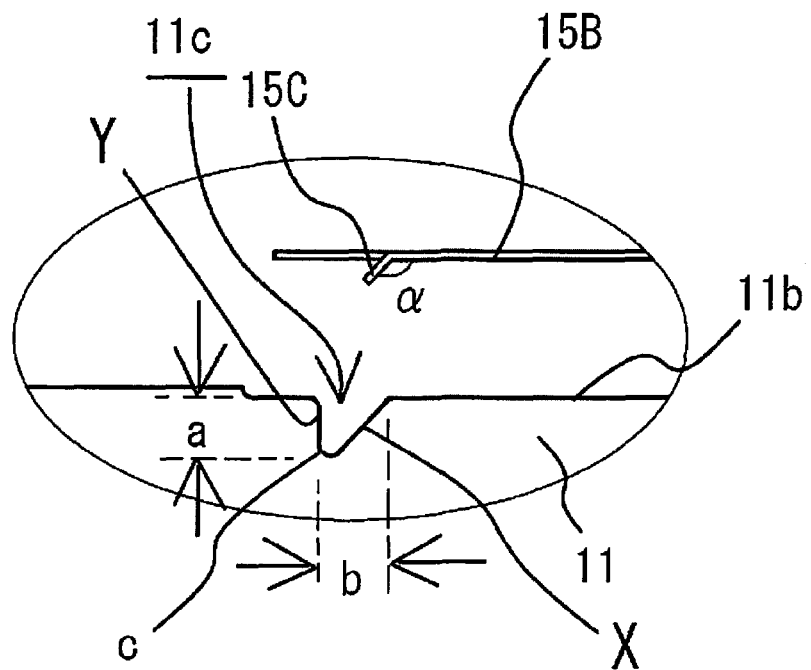
FIG. 3A is a schematic partial enlarged view of a cap and a substrate in FIG. 1A.

In one embodiment, as shown by 11c in FIG. 1D, the shape can have two straight parts X and Y that extend so that their spacing narrows moving away from the side surface of the substrate, and a curved part (c in FIGS. 1D and 3A) that links these two straight parts.

These straight parts X and Y may both be inclined to the side surface of the substrate, or as shown in FIG. 1D, the straight part X may be inclined to the side surface moving away from the side surface of the substrate, and the straight part Y may be substantially perpendicular. The angle of the straight part X in this case preferably coincides with the bending angle of the tab discussed below (corresponding to the angle α shown in FIG. 3A), and is, for example, about 90 to 170°, with about 90 to 150° being preferable, and about 135±10° being more preferable.

In particular, it is preferable in the case that the straight part X disposed on the side opposite the other recess provided to the substrate has the above-mentioned inclination angle to the side surface of the substrate. This allows the tab to be easily latched and housed.

As shown in FIG. 6C, in another embodiment, the recesses can have a triangular shape in plan view and can be provided at the corners of the substrate, that is, openings that extend from the first side surface to the second side surface and the second main surface. The plan view shape of recesses in this case may be quadrangle or polygonal shape. In this case, the angle of the surfaces constituting the recesses (γ in FIG. 6C) can be the same as the angle α so as to coincide with the bending angle of the tabs discussed below. With recesses such as these, the tabs are fixed opposite the other recesses and tabs provided diagonally, so the cap can be more effectively kept in the proper position.

The radius of curvature of the curved part as shown c in FIG. 1D may be, for example, from about a few hundredths of a millimeter to a few millimeters.

The curved part c is usually disposed at the deepest position of the recess. Thus, the length from the side surface of the substrate to the curved part is called the depth of the recess. The depth a of the recess (a in FIG. 3A) is, for example, from about a few tenths of a millimeter to a few millimeters.

The widest part of the recess, that is, the width at the side surface (the length in the lengthwise direction, or b in FIG. 3A) is, for example, from about a few tenths of a millimeter to a few millimeters.

The height of the recess (the length in the direction along the side surface of the substrate) is, for example, from about a few hundredths of a millimeter to a few tenths of a millimeter.

The substrate may be formed from any material. Examples of the base material include single materials or composite materials of insulating materials such as glass, ceramics, resins, wood, pulp and paper; conductive materials such as semiconductor, metal (e.g., supper, silver, gold, an aluminum). The substrate may have a laminar structure or a single-layer structure of the same or different materials. Among them, metals, ceramics, resins, and the like are preferable.

The first main surface of the substrate has a light emitting region in which the light emitting element is mounted. Preferably, a plurality of light emitting elements are arranged in rows, in columns, or in a matrix in the light emitting region. This allows a high-output light emitting device to be obtained.

The number of light emitting elements is, for example, about {one to several dozen}×{one to several dozen}. The connection configuration of these light emitting elements include one or more circuits that are serial, parallel, parallel-series or series-parallel. The configuration may include a plurality of circuits of parallel-series or series-parallel array, such as two parallel×10 serial.

Using a connection configuration such as this allows the light output to be controlled independently for each circuit. Furthermore, each circuit may be electrically connected to a corresponding one of a plurality of light emitting elements having mutually different wavelength bands, allowing the light output of each emission wavelength also to be controlled independently. Also, in case where a circuit may undergo discontinuity due to breakage or the like of one or more light emitting elements in the circuit, discontinuity can be avoided in other circuits that do not include these broken light emitting elements.

The substrate may have wiring in order to electrically connect to the light emitting elements mounted in the above-mentioned light emitting region. This wiring may be formed on the base member of the substrate, or the wiring may be formed on a base and this product placed on the substrate.

Any material known in this field can be used for the wiring. For instance, copper, aluminum, gold, silver, or another such metal can be used. The thickness can be from a few microns to a few hundred microns, for example. It is also possible to form the wiring by a known method, such as plating or sputtering.

A capacitor, varistor, Zener diode, bridge diode, or other such protective element, a thermistor or other such temperature sensor, a temperature compensation element, or the like may be further provided on the substrate. This allows a high-performance light emitting device with improved reliability to be provided while keeping the size small. Also, a member with good heat dissipation for improving good heat dissipation or a connector or the like for supplying external power may be provided. These parts are preferably disposed outside the above-mentioned light emitting region, more preferably on the outside of the cap. Further, as will be discussed below, in the case that second side pieces of a metal frame are disposed on the substrate, these parts are preferably disposed on the outside of the cap and opposite to the second side pieces. This enhances the light extract efficiency of the light emitting device by reducing the absorption of light by the above-mentioned members, and also reduces deterioration of members caused when the above-mentioned members absorb light.

Cap

The cap is provided to the substrate on which the light emitting elements have been mounted, so as to cover the light emitting elements. The shape of the cap in plan view can be suitably determined as dictated by the shape of the substrate, the layout of the light emitting elements, and so forth. It is preferable for the plan view shape to be quadrangle.

The cap mainly has a light-transmissive member and a metal frame.

Light-Transmissive Member

The light-transmissive member is supported by the metal frame and is provided so as to cover the light emitting region. It is formed by a member that allows the light emitted from the light emitting elements to be extracted efficiently. For example, it will preferably transmit at least 90% of the wavelength of the light emitted from the light emitting elements.

This member can be formed, for example, from a thermoplastic resin, a thermosetting resin, glass, or the like, with glass being particularly preferable among them. In particular, in the case that the light emitting element emits ultraviolet light, inorganic glass that is not prone to deterioration is preferable. When the emission wavelength from the light emitting element is 300 nm or less, the use of quartz glass is preferable.

The shape of the light-transmissive member can be suitably determined as dictated by the shape of the metal frame and the region in which the light emitting elements are located. For example, the light-transmissive member is preferably quadrangle or circular in plan view.

The thickness of the light-transmissive member can be suitably selected according to the required thickness, optical characteristics, and so forth of the light emitting device, and is about 0.1 to 10 mm, for example. From another standpoint, the thickness of the light-transmissive member is preferably greater than the width of the gap of slits in the metal frame as will be discussed below. In the case that the light-transmissive member is disposed between the distal end and the top piece of a support component, its thickness preferably corresponds to this gap.

The light-transmissive member may be such that convex lens shapes, concave lens shapes, dome shapes, or bumpy shapes are arranged in order to control the light distribution. A plurality of at least one shape may be arranged on a single light-transmissive member to create a fly-eye lens, for example.

A dielectric multilayer film, also called an AR coating, for example, that improves the transmission of light from the light emitting elements may be provided to the surface of the light-transmissive member, or fine irregularities that diffuse light may be provided.

Metal Frame

The metal frame supports the light-transmissive member.

The metal frame preferably supports the light-transmissive member by directly squeezing it, clamping it, etc.

When an organic substance used in the light emitting device deteriorates, its components vaporize or scatter, and may contaminate the surface of the light-transmissive member. This contamination could decrease the optical transmissivity of the light-transmissive member, that is, may lead to an increase in optical absorptivity, and this would increase the amount of heat generated in the parts of the light-transmissive member. As a result, the reliability of the light emitting device may be diminished.

Also, while it is unlikely that solder or another such metal-based bonding material will deteriorate like an organic substance, there is the risk that the light-transmissive member will be damaged, or deformed, etc., by heat during the bonding of the metal frame and the light-transmissive member.

Meanwhile, in the case that, as in this embodiment, the light-transmissive member is supported only by the metal frame, and no adhesive agent contains organic substances, in other words, in the case that the metal frame is not bonded to the light-transmissive member with the adhesive agent, the light-transmissive member will not fall out and there will be no contamination of the surface, the light-transmissive member can be securely fixed over an extended period of time, and the reliability of the light emitting device can be enhanced. In particular, deterioration of an organic substance is more likely to occur the shorter is the emission wavelength of the light emitting elements (UV rays). Thus, the light emitting device in this embodiment can be favorably applied to light emitting devices that emit ultraviolet light. Also, cracking and other damage to the light-transmissive member that would be caused by distortion arising from the difference in the coefficient of thermal expansion between the light-transmissive member and the metal frame can be prevented. Thus, the light emitting device in this embodiment can also be preferably applied when glass or another such material with a low coefficient of thermal expansion is used as the light-transmissive member.

The material of the metal frame is a metal, examples include copper, iron, nickel, chromium, aluminum, silver, gold, titanium, and alloys of these.

The shape of the metal frame can be suitably determined as dictated by the shape of the light-transmissive member. It is particularly preferable for the metal frame to be quadrangle in plan view.

The metal frame may have a light reflecting material formed by plating, coating, or the like on its surface. This reduces the absorption of light, improves the light extract efficiency of the light emitting device, and suppresses heat generation by the parts. A light absorbing material may also be provided partially.

The metal frame has at least one side piece and one tab. Preferably, it further has a top piece. It is also preferable that it has slits and/or protrusions.

Side Pieces

The side pieces extend toward the substrate from above the first main surface of the substrate in the metal frame. That is, they extend toward the surface of substrate from above the first main surface of the substrate so as to cover the light emitting elements. In the case that the metal frame is quadrangle in plan view, it may have two pairs of side pieces running along the two sides of the quadrangle metal frame. For example, it may have a pair of first side pieces and a pair of second side pieces corresponding to the side surfaces of the substrate discussed above.

As shown in FIG. 1A, in the above case, the first side pieces preferably extend from above the first main surface of the substrate to the side surfaces of the substrate, running along the side surfaces of the substrate, so as to cover the side surfaces of the substrate. The second side pieces preferably extend toward the substrate surface from above the first main surface of the substrate, and are disposed with their ends in contact on the substrate. That is, the second side pieces preferably have their ends supported by the first main surface of the substrate. This configuration prevents the metal frame from shifting, etc., in the up and down direction of the metal frame, and allows the light-transmissive member to be fixed at the specified position with respect to the substrate.

The ends of the side pieces may be the ends of the metal sheet that constitutes the metal frame (hereinafter referred to as cut ends), or may be portions formed by bending the metal sheet into ends (hereinafter referred to as bent ends), or may have both of these portions. In the case that bent ends are used, it is preferable for the distal end of the second side pieces of the metal sheet on the side closest to the substrate to be bent to the inside of the metal frame. This bent portion of the second side pieces can function as a retainer for the light-transmissive member, allowing the light-transmissive member to be held by and fixed to the metal frame. In particular, the bent portion that functions as a retainer is preferably disposed along part of the overall length of the second side pieces, such as in the center. Thus using part of the overall length of the side pieces as the bent ends makes the bending processing easier. In the case that there is a combination of bent ends and cut ends, the positions of their lower ends preferably coincide.

The first side pieces and second side pieces may be connected at the corners of the metal frame, but they may instead be separated. For example, the length of one or both of them may be shorter than the length of the light-transmissive member. This facilitates processing of the metal frame, attachment of the light-transmissive member to the metal frame, and so forth.

Figure 7:
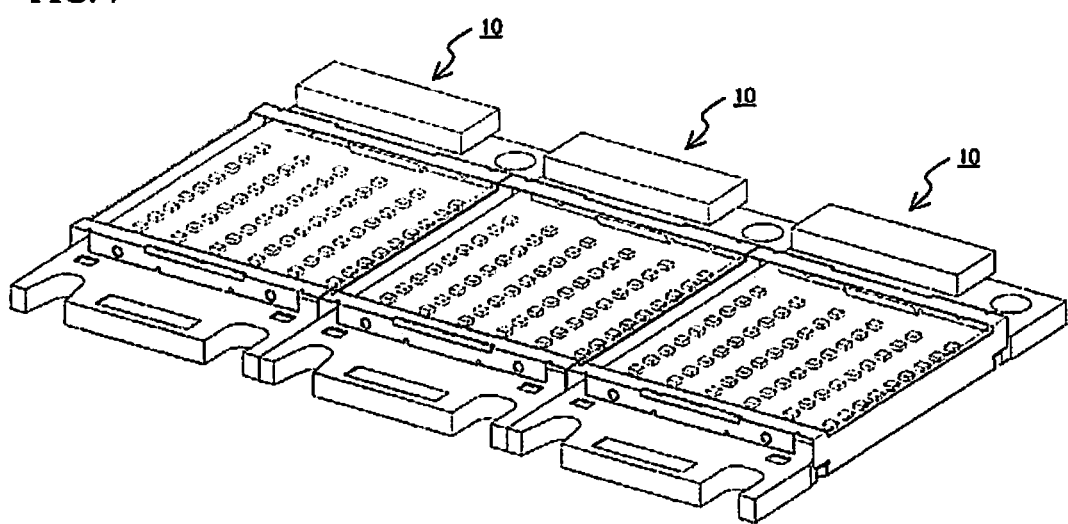
FIG. 7 is a schematic side elevational view of a light source module.

The first side pieces preferably has a portion which is shorter in height than the other portions of the first side pieces by cutout(s in FIG. 4) on their top end part, and preferably a portion of the side surface of the light-transmissive member expose from the cutout. This may reduce optical absorption by the metal frame, and improve the light extract efficiency. In particular, when a plurality of light emitting devices are made into a linear light source module in which their first side pieces are arranged to be adjacent each other as shown in FIG. 7, providing cutouts to the first side pieces allows the light distribution to be spread out in the direction in which the light emitting devices are arranged. As a result, there will be less of a decrease in the light quantity between the light emitting devices, that is, a light source module can be obtained that has good uniformity of the intensity distribution of light in the direction in which the light emitting devices are arranged.

The height f of the first side pieces is preferably greater than the height g of the second side pieces. This allows the side surfaces of the substrate to be clamped by the first side pieces, and at the same time allows the second side pieces to be disposed on the top surface of the substrate. As a result, the light-transmissive member can be fixed more securely, and the light emitting device can be made more compact. Furthermore, disposing the second side pieces on the substrate allows the distance from the emission surface of the light emitting element to the bottom surface of the transmissive material (the light incident surface) to be kept constant, making it possible to maintain the optical characteristics.

The height f of the first side pieces may be slightly less than, equal to, or slightly greater than the total of the thickness of the substrate, the thickness of the light-transmissive member, and the height of the space required for the light emitting region. The term "equal" in the present specification encompasses a range that will not affect the characteristics, manufacture, and so on of the light emitting device. For example, fluctuation of about a few dozen microns to a few hundred microns is permissible.

The thickness of the first side pieces is preferably less than the thickness of the second side pieces. This allows the light emitting device to take up less surface area in plan view. That is, there is only an increase in the small thickness of the first side pieces on both sides of the substrate, and the size of the light emitting device itself can be kept small. Also, at a given size of the light emitting device, the opening in the metal frame, can be made larger, and light extract can be increased while maintaining the compact size of the light emitting device. Furthermore, at a given size of the light emitting device, the distance between the metal frame and the light emitting element mounted on the substrate can be kept large, and the absorption of the light from the light emitting element, as well as the attendant generation of heat, can be reduced.

Subjecting only the first side pieces to thin-film processing with a press or the like is an example of the method for reducing the thickness of just the first side pieces.

Also, the thickness of the metal sheet constituting the metal frame may be the thickness of the first side pieces. That is, the first side pieces may not be provided with portions that are bent or portions that protrude, and the thickness of the first side pieces may be the same as the thickness of the metal sheet, keeping it less than the thickness of the second side pieces. This may reduce the cost of the bending and other such working.

This metal frame can be easily manufactured by shaping a metal frame that is in the form of sheet metal into a frame shape by cutting, deforming, bending or the like with a known method such as wire cutting or using a servo brake press. The thickness of the sheet metal can range from about a few hundredths of a millimeter to 1 mm. This thickness is preferably uniform over the whole frame, except for the first side pieces.

Tabs

The tabs are provided so as to extend from the side pieces of the metal sheet, are used to fix a cap to the substrate, and are latched and housed in the above-mentioned recesses of the substrate. The tabs are preferably formed extending from the first side pieces that extend along the side surfaces of the substrate. It is particularly preferable for the tabs to be provided at the lower ends of the first side pieces. The term "lower ends" here means the portion of the first side pieces that is closest to the second main surface of the substrate when the cap is fixed to the substrate. Also, in the case that the first side pieces are provided so as to clamp the side surfaces in the lengthwise direction of the substrate, it is preferable that the tabs are provided on both sides thereof, that is, at the closest position of the first side pieces in the short-side direction of the substrate, for example.

The number of tabs preferably corresponds to the number of recesses provided to the side surfaces of the substrate. For example, one tab may be provided to each of the pair of first side pieces, but preferably two or more tabs are provided. Also, different numbers of tabs may be provided to the two first side pieces, but preferably the number is the same.

For instance, four tabs can be provided to a single cap, with one each provided on both ends of the first side pieces. Also, one or two tabs can provided to the two first side pieces and the two second side pieces, for a total of four or eight tabs provided to a single cap. This further reduces looseness between the substrate and the cap, and allows them to be assembled more stably.

As shown in FIGS. 6A to 6C, the tabs may be disposed so that two or more of them are housed in a single recess.

In a single metal frame, the number of surfaces of all the tabs and side pieces in contact with the substrate is preferably three or more, with the direction of each surface being different, and more preferably the number is a multiple of three. This reduces the amount of offset at a single plane orientation, reduces distortion caused by external force at two plane orientations, and disperses external force over a wider range so that distortion and looseness can be better suppressed.

The shape of a single tab may be circular, elliptical, polyhedral, or any of various other shapes viewed from the side of the metal frame. It is preferable that a part of the metal sheet that constitutes the metal frame is bent, extruded, scooped out, cut, or otherwise processed to form a protruding shape, and part of this protruding shape is bent to create the tab at the tip.

The tabs may have a constant width from their distal end to the part where they connect to the side pieces, or the width may narrow as being away from the part where they connect to the side pieces. It is particularly favorable for the width to narrow as being away from the bent part (Q in FIG. 3C). This allows the tabs and the substrate to be easily fixed. For example, there can be two straight parts (P and Z in FIGS. 3B and 3C) where the spacing narrows as being away from the bent part.

Figure 3B:
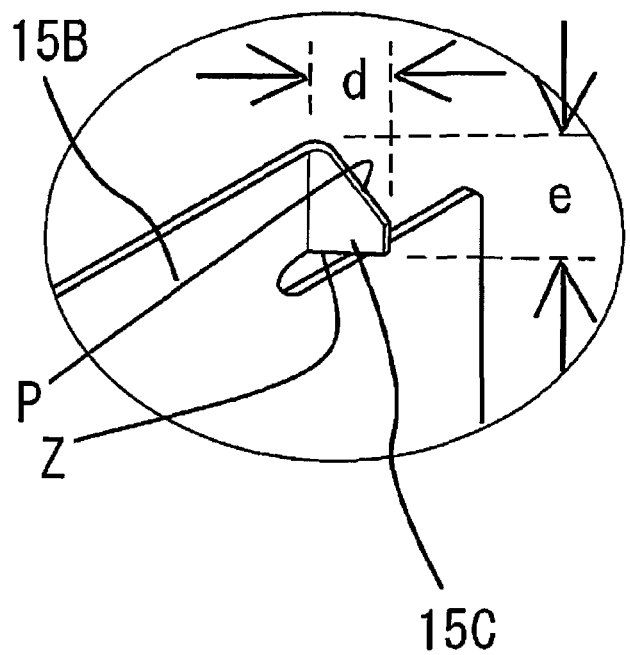
FIG. 3B is a schematic partial enlarged view of the cap in FIG. 1A.
Figure 3C:
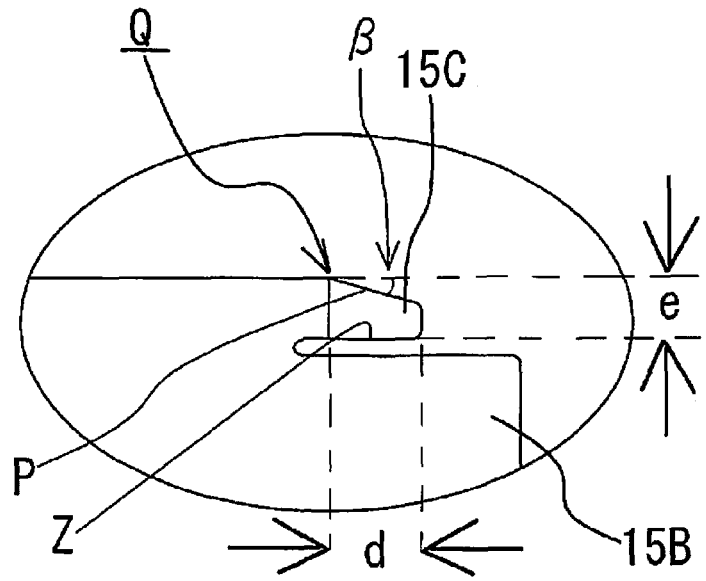
FIG. 3C is a schematic partial enlarged view of the cap near an unbent tab in FIG. 1A.

The intersection of the two straight parts P and Z, that is, the distal end of the tab, may have a rounded shape, or it may have another straight part that connects the two straight parts P and Z as shown in FIG. 3B.

These straight parts P and Z may both be inclined with respect to the first main surface of the substrate, or just the straight part P may be inclined to the first main surface of the substrate as being away from the bent part, and the straight part Z may be substantially parallel. The angle of the inclination in this case ($\beta$ in FIG. 3C) is about 20 to 70°, for example.

The shape of the tabs may be in line symmetry, but need not be symmetrical.

It is particularly preferable that the straight part of the tab disposed on the first main surface side of the substrate has the above-mentioned inclination angle to the first main surface of the substrate.

When the length from the bent part to the distal end is the length of the tab (d in FIG. 3B), the length d of the tab is from a few tenths of a millimeter to a few millimeters, for example.

The width at the widest part of the tab, for example, at the bent part (such as the length in the thickness direction, e in FIG. 3B) ranges from the thickness of the metal sheet to about 10 mm, for example.

The bending direction of the tab is preferably parallel to the height direction of the first side pieces, so that the tab will be disposed parallel to the height direction of the first side pieces. Furthermore, the tabs preferably have a shape that is bent in a direction parallel to the second side pieces. The bending here is about 30 to 90°, for example, with about 30 to 60° being preferable, and 45±10° being more preferable. This shape of the tabs will allow the tabs to be housed in the above-mentioned recesses, which allows not only fixing in the thickness direction of the substrate, but also secure fixing without any offset in the horizontal direction of the substrate.

Top Piece

The top piece is a part of the metal frame, and is disposed over the light-transmissive member. It is disposed so as to cover part of the light-transmissive member. Specifically, the portion of light-transmissive member near the side pieces of the metal frame is covered by the top pieces. Providing this top piece helps prevent the light-transmissive member from coming off the metal frame.

The top piece is preferably disposed so as to cover only part of the outer periphery of the light-transmissive member. It is particularly favorable in the case where the top piece is contiguous (adjacent) to the second side pieces, and is connected to the first side pieces only at the width of the top piece. In other words, the top piece is preferably disposed in the form of a band that extends in the direction in which the second side pieces extend (such as the short-side direction). This allows the light-transmissive member to be held without providing a cover margin of the light-transmissive member at the locations along the first side pieces. As a result, a light emitting device that is more compact and has a larger opening area can be obtained.

For example, in the case where a light source module is created in which a plurality of light emitting devices are arranged in a line so that the first side piece is adjacent as shown in FIG. 7, the spacing between the openings in the direction in which the light emitting devices are arranged can be narrowed by not having the top pieces disposed along the first side pieces. This allows a light source module to be obtained in which there is little decrease in the light quantity between the light emitting devices, that is, in which there is excellent continuity in the light intensity distribution in the direction in which the light emitting devices are arranged.

The width of the top piece, that is, the length of the portion disposed above the light-transmissive member, is preferably narrower, as long as it is still possible to hold down the light-transmissive member. For example, a width ranging from the sheet thickness to 10 mm is preferable.

Slits

In the case where the top piece and the side pieces are formed by bending a metal sheet, slits are preferably provided between each of the top piece and the pair of second side pieces. There may be only one slit, or there may be two or more. Providing slits facilitates the bending of the metal sheet. It also raises the yield level corresponding to deformation of parts under external force, and allows deformation in the assembly of the metal frame and the substrate to be performed under the yield point.

The slits may be disposed on a pair of edges of the light-transmissive member.

The width of the slits is, for example, equal to about one-half to one-fifth the width of the side pieces (such as the width of the second side pieces).

Protrusions

The metal frame may further have protrusions for fixing the light-transmissive member to the side pieces. There may be just one protrusion, or there may be two or more. It is particularly preferable for the protrusions to be provided to a pair of opposing side pieces, and more preferable to be provide to the inside of the side pieces. The protrusions may be provided to the first side pieces, but preferably two or more are provided to each of the second side pieces. This is because that there is no need to make separate provision of spaces for forming the protrusions, and light emitting device can be kept small.

The protrusions may be formed by making the metal frame thicker, but are preferably protrusions that are produced by pressing part of the metal sheet constituting the metal frame from the surface on the opposite side from the protrusions.

The height of the protrusions can range from a few hundredths of a millimeter to a few tenths of a millimeter.

The metal frame preferably has cutouts, holes, portions where the metal frame thickness or length is reduced, etc. (such as r, u, and t in FIG. 4) in its side pieces, the deformed parts of the side pieces, or near these areas, etc. Providing these cutouts and so forth allows deformation of the shape of the metal frame in which it is bent in a lateral direction (such as the short-side direction) during mating with the substrate to be performed under the yield point in the assembly of the substrate and the metal frame.

Embodiment 1

As shown in FIGS. 1A to 1D, the light emitting device 10 in this embodiment has a plurality of light emitting elements 12, a substrate 11, and a cap 13 that covers the light emitting elements 12.

Light Emitting Elements 12

The light emitting elements 12 are, for example, composed of a nitride semiconductor and have an emission peak wavelength of 365 nm, and are substantially quadrangle in plan view. The light emitting elements are mounted on the substrate 11, and are electrically connected to positive and negative electrodes (wiring) provided to the substrate by using wires and an electroconductive adhesive agent.

Substrate 11

The substrate 11 is made from a sheet of aluminum (2 mm thick) in which the first main surface has a planar shape that is rectangular (25×45 mm), and has a first main surface 11a, a second main surface 11d on the opposite side from the first main surface 11a, and side surfaces that are adjacent to these. The side surfaces consist of a pair of side surfaces 11b in the lengthwise direction of the substrate, and a pair of side surfaces 11e in the short-side direction. A white, insulating resist is provided to the first main surface of the substrate 11.

Recesses 11c are formed in the second main surface 11d in the lengthwise direction.

The recesses 11c are used to house tabs 15C of a metal frame 15. A total of four of the recesses 11c are formed, with two each formed in the side surfaces 11b of the substrate 11. The recesses 11c each have an opening from the side surface 11b to the second main surface 11d. When viewed from the side surface 11e side of the substrate 11, the recesses 11c are quadrangle, and when viewed from the second main surface 11d side of the substrate, they have a shape having two straight parts X and Y that become narrower as being away from the recesses 11c of the substrate 11, and a curved part c that links the two straight parts X and Y.

Of the two straight parts X and Y, the straight part X (the one closer to the middle of the substrate) is inclined at 135° to the second main surface 11d of the substrate 11, while the straight part Y (the one closer to the short-side direction of the substrate) is substantially perpendicular to the second main surface 11d. The recesses 11e are asymmetrical to a line that is perpendicular to the first main surface 11a of the substrate 11 and passes through the center of the width of a side surface.

The radius of curvature of the curved part c is 0.2 mm. The depth of the recesses 11c (a in FIG. 3A) is usually 0.5 to 1.5 mm. The widest part of the recesses 11c (the width at the side surface, the length along the lengthwise direction, or b in FIG. 3A) is 1 to 1.5 mm. The height of the recess (the length in the thickness direction of the substrate 11) is 1.2 mm.

The substrate 11 has wiring for connecting the light emitting elements 12 to the first main surface 11a. On this circuit pattern of the wiring is a light emitting region in which the light emitting elements 12 are mounted. Sixty the light emitting elements 12 are mounted in the light emitting region, arranged in a six-by-ten matrix.

Connectors and other such electronic parts 16 are mounted at the end of the first main surface 11a of the substrate 11.

Cap 13

The cap 13 is provided to the substrate 11, on the first main surface of which the light emitting elements 12 are mounted, so as to cover the light emitting elements 12. The planar shape of the cap 13 is quadrangle. The cap 13 has a light-transmissive member 14 and the metal frame 15.

Light-Transmissive Member 14

The light-transmissive member 14 is formed from glass, and is quadrangle in plan view. Its size is 24.6×27.1 mm, and it is 0.7 mm thick.

Metal Frame 15

The metal frame 15 supports the light-transmissive member 14. The metal frame 15 clamps the light-transmissive member 14 by direct contact with the light-transmissive member 14, and no adhesive agent is used between it and the light-transmissive member 14.

The metal frame 15 is composed of a sheet of aluminum, and is quadrangle in plan view.

The metal frame 15 has side pieces that extend toward the substrate from above the first main surface of the substrate. The side pieces consist of first side pieces 15B that extend in the lengthwise direction of the substrate 11, and second side pieces 15D that extend in the short-side direction of the substrate 11.

The metal frame 15 further has a top piece 15A and tabs 15C.

First Side Pieces 15B and Second Side Pieces 15D

The first side pieces 15B extend toward the surface of the substrate 11 from above the first main surface of the substrate 11, and are provided along the side surfaces 11b of the substrate 11.

The second side pieces 15D extend toward the first main surface 11a of the substrate 11, their ends are disposed on the substrate 11, and they support the first main surface 11a of the substrate 11.

The ends of the second side pieces 15D disposed on the substrate 11 are cut ends of the metal frame 15 on both sides, and become bent ends in the middle part. The bent ends can function as supports 15F for holding down the light-transmissive member 14.

The first side pieces 15B and the second side pieces 15D are separated from one another at the corners of the metal frame 15 by the second side pieces 15D are not as long as the light-transmissive member 14.

The height f of the first side pieces 15B is greater than the height g of the second side pieces 15D. That is, the height f of the first side pieces 15B is 4 mm, and the height g of the second side pieces 15D is 1.8 mm. The height f of the first side pieces 15B is slightly greater than the total of the thickness of the substrate 11 plus the thickness of the light-transmissive member 14. The height s of the cutouts of the first side pieces 15B is 0.6 mm.

The thickness of the first side pieces is 0.1 mm, and the thickness (width) of the second side pieces including the bent ends is 21 mm.

Tabs 15C

The tabs 15C are used to fix the cap 13 to the substrate 11, and are housed in the recesses 11c of the substrate 11. The tabs 15C are provided extending from the first side pieces 15B. The tabs 15C are provided at the ends of the first side pieces 15B, that is, at the ends of the first side pieces 15B that are closest to the second main surface 11d of the substrate 11, and at the ends that are closest to the short-side direction of the substrate 11.

Two of the tabs 15C are disposed on each side of the pair of first side pieces 15B.

The shape of the tabs 15C approximates a pentagonal shape, and the tabs are formed by cutting/deforming/bending part of the metal sheet that makes up the metal frame 15 by a method known in this field.

The tabs 15C narrow toward the distal ends of the bent parts.

The tabs 15C have a straight part Z on the side closer to the light-transmissive member 14 that is substantially parallel to the light-transmissive member 14 and the first main surface 11a of the substrate 11, and have a straight part P on the side farther away from the light-transmissive member that is inclined at an angle of about 45° to the first main surface 11a.

The length of the tabs 15C (d in FIG. 3B) is a few tenths of a millimeter. The width of the bent parts at the widest part of the tabs 15C (such as the length in the thickness direction; e in FIG. 3B) is from a few tenths of a millimeter to a few millimeters, for example.

The tabs 15C are bent parallel to the height direction of the first side pieces 15B, so as to be disposed parallel to the height direction of the first side pieces 15B. The tabs 15C are bent in a direction parallel to the second side pieces 15D.

Top Piece 15A

The top piece 15A is disposed above the light-transmissive member 14 and adjacent to the second side pieces 15D on the metal frame 15. It is disposed in a slender shape extending along the short-side direction in which the second side pieces 15D extend.

The distance that the top piece is away from the second side pieces, which is the width of the top piece (the length of the portion disposed above the light-transmissive member) is 2 to 10 mm.

Slits 15E

The metal frame 15 has slits 15E between each of the top pieces 15A and the pair of second side pieces 15D. The width of the slits 15E is about one-half the width of the second side pieces 15D (the length in the short-side direction, for example).

Protrusions 15G

The metal frame 15 has a total of two protrusions 15G that fix the light-transmissive member 14 to the second side pieces 15D, on both sides thereof. The protrusions 15G are formed by pushing portions of the second side pieces 15D inward. The height of the protrusions 15G is a few tenths of a millimeter, for example. The protrusions 15G are circular, with a diameter of a few tenths of a millimeter.

With the light emitting device 10 in this embodiment, because the substrate 11 has the recesses 11c in the side surfaces 11b, the tabs 15C can be utilized for simple and reliable fixing of the cap 13. In particular, in the case where the recesses 11c are in a shape with an increased surface area that is in contact with the tabs 15C, the cap 13 can be effectively prevented from shifting out of place.

The tabs are formed by bending, and are latched and housed in the recesses of the substrate, which not only provides fixing in the thickness direction of the substrate, but also affords secure fixing thereby reducing occurrence of shifting of the cap in the horizontal direction with respect to the substrate.

Also, because four tabs of the metal frame and four recesses of the substrate are provided at locations near the each of corners of a quadrangle shape, the members can be assembled more stably, with less looseness.

In the case that the thickness of the first side pieces is less than the thickness of the second side pieces, the area taken up by the light emitting device will be about the same as the size of the substrate, that is the size of the substrate+a thickness less than the first side pieces on both sides), which allows the smaller size of the light emitting device itself to be maintained. Making only the first side pieces thinner can be accomplished by a method that is known in this field, such as bending a piece of sheet metal as discussed above, or forging just these first side pieces.

In the case where the light-transmissive member 14 and the metal frame 15 are in direct contact, without any adhesive or the like being used, at the cap 13, and the light-transmissive member 14 is supported by the metal frame 15, then the light-transmissive member can be supported without the use of a material that is tend to degrade, such as the organic substances that constitute adhesive agents and so forth, so the light-transmissive member can be securely fixed over an extended period without shifting out of place, etc., and this improves the service life of the light emitting device. Also, since the bonding region where the adhesive agent or the like is used can be eliminated, a more compact light emitting device can be obtained.

In the case where the second side pieces of the metal frame extend toward the surface of the substrate, and their ends are disposed on the substrate, and these ends support the first main surface of the substrate, the metal frame can be prevented from shifting out of place, etc., and the light-transmissive member can be fixed more securely to the substrate in the desired position.

In the case where the metal frame 15 has slits, etc., and/or a configuration in which the first side pieces and the second side pieces are separated, bending will be easier and a light emitting device having a high-precision cap can be obtained.

Because the height f of the first side pieces is greater than the height g of the second side pieces, the first side pieces can clamp the side surfaces of the substrate, and at the same time, the substrate top surface can be supported by the second side pieces. As a result, shifting to the right, left, up, or down is prevented, so the light-transmissive member can be fixed more securely.

Embodiment 2

Figure 4:
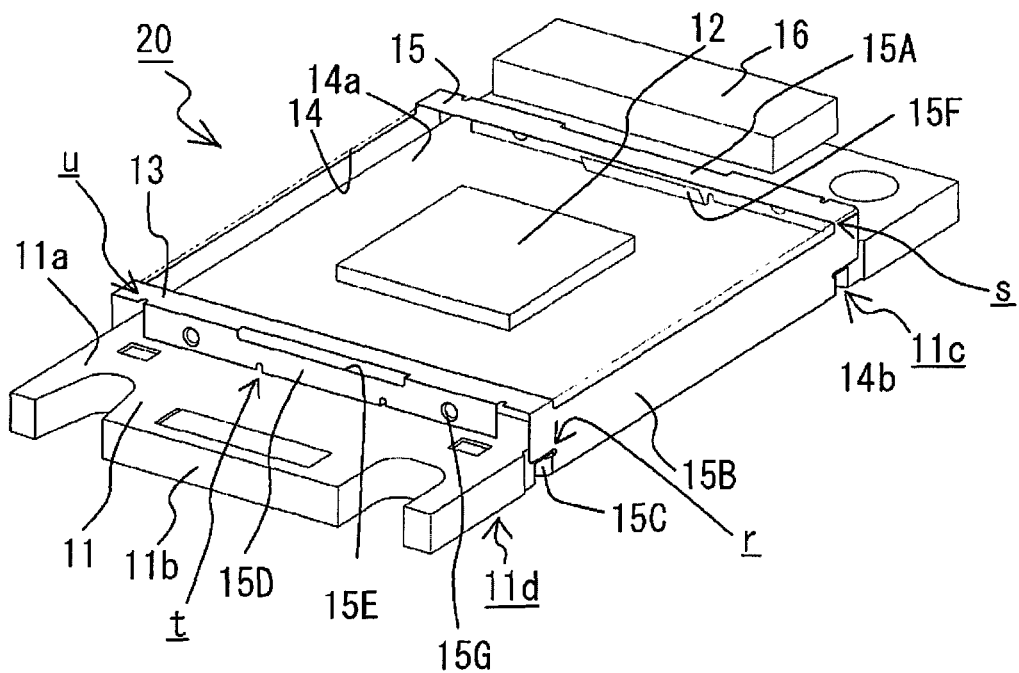
FIG. 4 is a schematic oblique view of another embodiment of a light emitting device.

As shown in FIG. 4, the light emitting device 20 in this embodiment is configured substantially the same as the light emitting device 10 in Embodiment 1, except that only one light emitting element 12 is mounted, and the scale of the light emitting device 20 itself is smaller. Thus, the effects are the same as those of the light emitting device 10.

Embodiment 3

Figure 5A:
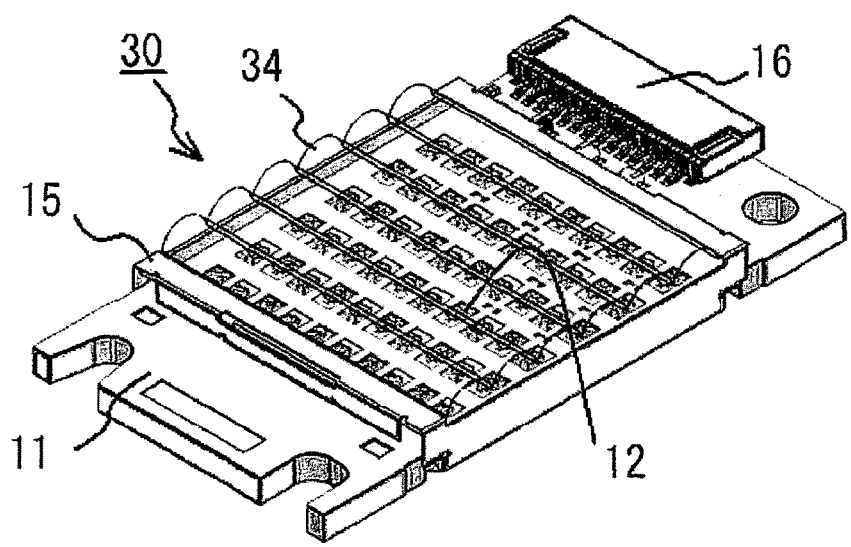
FIG. 5A is a schematic oblique view of yet another embodiment of a light emitting device.
Figure 5B:
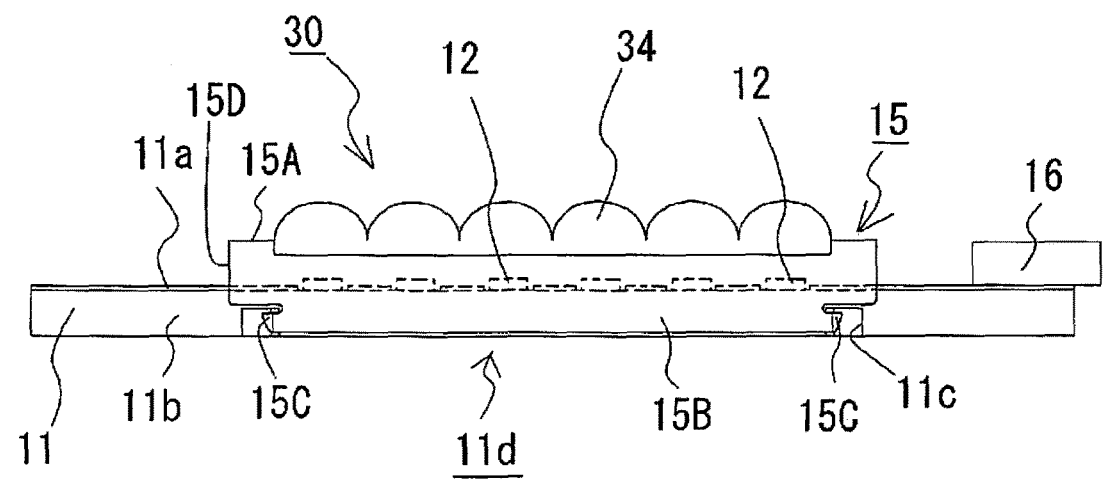
FIG. 5B is a schematic see-through first lateral side view of the light emitting device in FIG. 5A.

As shown in FIGS. 5A and 5B, the light emitting device 30 in this embodiment is configured substantially the same as the light emitting device 10 in Embodiment 1, except that the light emitting elements 12 are arranged in a 6×10 matrix, and the light-transmissive member 34 has a shape includes six dome-shaped rows. Thus, the effects are the same as those of the light emitting device 10.

Also, the desired light distribution can be obtained with the light-transmissive member 34.

Embodiment 4

As shown in FIGS. 6A to 6C, the light emitting device 40 in this embodiment contains one light emitting element 12, a substrate 41, and a cap that covers the light emitting element 12.

Substrate 41

The planar shape of the first main surface of the substrate 41 is substantially square. A total of four side surfaces of the substrate are formed, consisting of first side surfaces 41b and second side surfaces 41d.

Recesses 41c are disposed at the four corners of the substrate, in a form in which they have an opening from the first side surfaces 41b and the second side surfaces 41d to the second main surface 11d. The recesses 41c are quadrangle when viewed from the side surfaces 41e and 41b side of the substrate 41, and are in the form of an isosceles triangle when viewed from the second main surface 41d side of the substrate. The angle γ here is 45°.

Cap

The cap is provided to the substrate 41 on whose first main surface the light emitting elements 12 are mounted, so as to cover the light emitting elements 12. The planar shape of the cap is substantially quadrangle. The cap has a light-transmissive member 44 and a metal frame 45.

Light-Transmissive Member 44

The light-transmissive member 44 is formed from glass, and is substantially square in plan view.

Metal Frame 45

The metal frame 45 supports the light-transmissive member 44 without the use of an adhesive agent. The metal frame 45 has first side pieces 45B and second side pieces 45D that extend toward the substrate from above the substrate 41. The metal frame 45 further has a top piece 45A and tabs 45C.

First Side Pieces 45B and Second Side Pieces 45D

The first side pieces 45B and second side pieces 45D go all the way to the first side surfaces 41b and second side pieces 41e of the substrate 41. The maximum height of the first side pieces 45B and second side pieces 45D is 10 mm in both cases.

Tabs 45C

The tabs 45C are provided on both sides, extending from the first side pieces 45B and second side pieces 45D. The bending angle of the tabs 45C corresponds to the angle γ that constitutes the recesses 41c in the substrate 41.

Other than what is discussed above, the configuration here is substantially the same as that of the light emitting devices in Embodiments 1 and 2. Therefore, this embodiment has substantially same effect with that of light emitting device 10. With the light emitting device 40 in this embodiment, because a pair of tabs flanks each of the four corners of the substrate, shifting of the cap can be effectively prevented.

Embodiment 5

With the light emitting device module in this embodiment, three of the light emitting devices 10 are arranged so that the side surfaces 11b of the substrates 11 are adjacent to one another. Since only the thickness on both sides of the metal frame increases in addition to the lateral thickness of the substrates in the direction in which the light emitting devices are arranged, the module as a whole can be kept to an extremely compact size.

INDUSTRIAL APPLICABILITY

The light emitting device according to the present disclosure can be used for various kinds of light sources, such as light sources for printing ink curing, resin curing and exposure apparatus for a light source, projectors, illumination light sources, light sources for various kinds of indicators, light sources for automobile use, light sources for displays, back light sources for liquid crystal displays, light sources for sensors, signals, automobile use, channel control characters for channel boards.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a light emitting element;
    an electronic part;
    a substrate having
        a first main surface including a first region in which the light emitting element is mounted and a second region in which the electronic part is mounted, and
        a recess on a side surface adjacent to the first main surface,
    a cap covering the light emitting element and not covering the electronic part, and having
        a light-transmissive member and
        a metal frame that supports the light-transmissive member and has
            a first side piece extending toward the substrate from above the first main surface of the substrate to cover at least a part of the side surface of the substrate, the first side piece including a tab that is bent only once around an axis extending along a direction that intersects with the first main surface, with at least a part of the tab being housed in the recess of the side surface of the substrate, and
            a second side piece extending toward the substrate from above the first main surface of the substrate, an end of the second side piece being disposed on the first main surface of the substrate between the first region and the second region so that the second side piece blocks light from the light emitting element from leaking toward the electronic part.

2. The light emitting device according to claim 1, wherein the light-transmissive member is made of glass.

3. The light emitting device according to claim 1, wherein the metal frame is attached to the light-transmissive member without using an adhesive agent.

4. The light emitting device according to claim 1, wherein the metal frame is quadrangle in plan view.

5. The light emitting device according to claim 1, wherein the substrate and the metal frame are quadrangle in plan view, and
    the metal frame further includes an additional first side piece disposed on an opposite side of the substrate with respect to the first side piece to cover at least a part of an opposite side surface of the substrate, the additional first side piece including an additional tab with at least a part of the additional tab being housed in a recess of the opposite side surface of the substrate.

6. The light emitting device according to claim 1, wherein the metal frame further has a top piece disposed over the light-transmissive member.

7. The light emitting device according to claim 1, wherein the light-transmissive member is quadrangle in plan view, the metal frame is quadrangle in plan view, and includes an additional first side piece disposed on an opposite side of the substrate with respect to the first side piece to cover at least a part of an opposite side surface of the substrate.

8. The light emitting device according to claim 1, wherein the thickness of the first side piece is less than the thickness of the second side piece.

9. The light emitting device according to claim 7, wherein the metal frame further has a top piece disposed over the light-transmissive member, and
    the top piece is contiguous to a pair of the second side pieces.

10. The light emitting device according to claim 1, wherein
    the recess has an opening on a second main surface of the substrate on the opposite side from the first main surface.

11. The light emitting device according to claim 1, wherein
    the recess has a shape having two straight parts that become narrower as being away from the side surface of the substrate, and a curved part that connects the two straight parts in plan view.

12. The light emitting device according to claim 1, wherein
    the substrate is rectangular in plan view, the recess is formed on the side surface in the lengthwise direction.

13. A light source module comprising
    a plurality of light emitting devices of claim 1 aligned in a row.

14. The light source module according to claim 13, wherein
    the light-transmissive member is quadrangle in plan view,
    the metal frame are quadrangle in plan view, and includes an additional first side piece disposed on an opposite side of the substrate with respect to the first side piece to cover at least a part of an opposite side surface of the substrate, and
    a plurality of light emitting devices are arranged such that their first side pieces are adjacent to each other.

15. The light emitting device according to claim 1, wherein
    the light emitting element emits ultraviolet light.

16. The light emitting device according to claim 1, wherein
    the second side piece forms a bent end of the metal frame.

17. The light emitting device according to claim 1, wherein
    the metal frame further includes an additional first side piece disposed on an opposite side of the substrate with respect to the first side piece to cover at least part of an opposite side surface of the substrate, and an additional second side piece disposed an opposite side of light emitting element with respect to the second side piece, and
    each of the second side piece and the additional second side piece respectively forms a bent end of the metal frame.

18. The light emitting device according to claim 1, wherein the metal frame further includes an additional tab, the tab and the additional tab being respectively disposed on sides of the first side piece.

19. The light emitting device according to claim 1, wherein
the first side piece of the metal frame is substantially flat except for where the tab is bent.

20. The light emitting device according to claim 1, wherein
a portion of an upper edge of the first side piece of the metal frame corresponding to the first region of the substrate in which the light emitting element is mounted forms a straight line.

21. The light emitting device according to claim 1, wherein
the tab is disposed on a lower side of the first side piece.

22. The light emitting device according to claim 1, wherein
an upper surface of the electronic part is positioned higher than an upper surface of the light emitting element.

* * * * *